(12) United States Patent
Simmons

(10) Patent No.: US 9,976,711 B2
(45) Date of Patent: May 22, 2018

(54) SPEED TAPE ASSEMBLY FOR LED STRIP TAPES IN LIGHT BOX

(71) Applicant: Michael Simmons, Santa Clarita, CA (US)

(72) Inventor: Michael Simmons, Santa Clarita, CA (US)

( * ) Notice: Subject to any disclaimer, the term of this patent is extended or adjusted under 35 U.S.C. 154(b) by 178 days.

(21) Appl. No.: 15/239,579

(22) Filed: Aug. 17, 2016

(65) Prior Publication Data

US 2016/0356441 A1 Dec. 8, 2016

(51) Int. Cl.
| | |
|---|---|
| *F21S 4/00* | (2016.01) |
| *F21V 21/00* | (2006.01) |
| *F21S 4/24* | (2016.01) |
| *H05K 1/18* | (2006.01) |
| *F21V 19/00* | (2006.01) |
| *F21V 23/06* | (2006.01) |
| *F21Y 115/10* | (2016.01) |
| *F21Y 113/17* | (2016.01) |
| *H05K 1/02* | (2006.01) |
| *H05K 3/36* | (2006.01) |

(52) U.S. Cl.
CPC ............... *F21S 4/24* (2016.01); *H05K 1/189* (2013.01); *F21V 19/003* (2013.01); *F21V 23/06* (2013.01); *F21Y 2113/17* (2016.08); *F21Y 2115/10* (2016.08); *H05K 1/0286* (2013.01); *H05K 3/363* (2013.01); *H05K 2201/094* (2013.01); *H05K 2201/10106* (2013.01); *H05K 2201/10287* (2013.01); *H05K 2203/0228* (2013.01)

(58) Field of Classification Search
CPC .................... F21S 4/24; H05K 1/189
USPC ..................................... 362/249.06
See application file for complete search history.

(56) References Cited

U.S. PATENT DOCUMENTS

| | | | |
|---|---|---|---|
| 5,107,408 A * | 4/1992 | Vernondier | E04F 19/061 362/219 |
| 9,557,049 B1* | 1/2017 | Rapisarda | F21V 33/0008 |
| 2004/0252501 A1* | 12/2004 | Moriyama | F21V 19/0025 362/238 |
| 2005/0128751 A1* | 6/2005 | Roberge | F21K 9/00 362/276 |
| 2006/0022214 A1* | 2/2006 | Morgan | F21K 9/00 257/99 |
| 2006/0092634 A1* | 5/2006 | Hiyama | G09F 13/22 362/231 |
| 2006/0198128 A1* | 9/2006 | Piepgras | B29C 39/10 362/147 |

(Continued)

*Primary Examiner* — Bryon T Gyllstrom
(74) *Attorney, Agent, or Firm* — Barry Choobin; Patent 360

(57) ABSTRACT

The embodiments herein provide a self-adhesive tape for providing electrical connections to a plurality of Light Emitting Diode (LED) strip tapes for illuminating. The self-adhesive tape is attached using an adhesive strip at the back side of the self-adhesive tape. Several first set of copper pads on the self-adhesive tape are configured to provide electrical connection to the the LED strip tapes by soldering the copper pad on each LED strip tape with a first set of copper pad on the self-adhesive tape. Several second set of copper pads provided on the self-adhesive tape are configured for supplying power for lightening the plurality of LED strip tapes. The power is supplied by soldering one second set of copper pad with powers wires connected to a DMX switch controller.

17 Claims, 5 Drawing Sheets

(56) References Cited

U.S. PATENT DOCUMENTS

| | | | | |
|---|---|---|---|---|
| 2006/0245191 A1* | 11/2006 | Ratcliffe | ................. | G09F 9/33 |
| | | | | 362/246 |
| 2014/0313716 A1* | 10/2014 | Lang | ...................... | H01L 35/30 |
| | | | | 362/235 |
| 2016/0178172 A1* | 6/2016 | Boyink | ................ | F21V 23/003 |
| | | | | 362/123 |

* cited by examiner

SPEED TAPE ASSEMBLY FOR LED STRIP TAPES IN LIGHT BOX

BACKGROUND

Technical Field

The embodiments herein are generally related to lighting systems. The embodiments herein are particularly related to Light Emitting Diode (LED) lighting systems provided with LED strip tapes. The embodiments herein are more particularly related to a speed tape assembly for LED strip tapes in light box. The embodiments herein are especially related to a speed tape assembly for assembly for providing better mechanical and electrical connections between multiple LED strip tapes.

Description of the Related Art

Over the past few decades, modular Light emitting diode (LED) lights have been used widely for multiple applications. LED lights have become more and more popular due to multiple characteristics such as size, appearance, long life, low current requirements etc. LED light is used for both decorative purposes and utility purposes. LED lights are used for lighting various utilities such as book shelves, office hutches, under cabinets, car interiors, kitchen lightening, and any other venues.

Typically, an LED strip tape comprises a plurality of LED lights attached on a front side of a flexible strip along a length of adhesive strip of strip or along the back side of the flexible strip. The LED strip tapes are installed by soldering one end of an LED strip tape to power supply. However, soldering of each LED strip tape to the power supply becomes a tedious task during an installation of a plurality of LED strip tapes. Further, the soldering of the narrow copper pads on the LED strip tapes generally requires experienced or trained personnel.

Recently, several LED connectors are developed to eliminate a need for soldering the LED strip tapes to power supply. There are several types of LED connectors. The types of LED connectors include a locking style connector, snap connectors etc. The LED connector comprises wider internal contacts and a locking mechanism for ensuring reliable connection with the copper pad contacts on the LED strip tapes. However, in most cases, strong connections are unable to be established using soldering technique. Further, soldering techniques used in LED strips tapes have few drawbacks. The soldered contacts on the narrow copper pads on the LED strip tape is tend to break during due to rough handling. Further, the soldering of LED tapes for illuminating a large area is a tedious and time consuming task.

Hence, there is a need for an assembly for providing an effective mechanical and electrical connections for a plurality of LED strip tapes. There is further a need for a mechanism to reduce the efforts involved in soldering the electrical contacts for a plurality of LED strip tapes used for lighting a large area. Still, there is a need for a mechanism for providing power supply connection to a plurality of LED strip tape. Yet there is a need for a speed tape assembly for installing and connecting a plurality of LED strip tapes in a light box.

The above mentioned shortcomings, disadvantages and problems are addressed herein and which will be understood by reading and studying the following specification.

OBJECTS OF THE EMBODIMENTS

The primary object of the embodiments herein is to provide an assembly for enabling better mechanical and electrical connections for Light emitting diode (LED) strip tapes.

Another object of the embodiments herein is to provide a self-adhesive tape for enabling a user to install a plurality of LED strip tapes with a minimum gap between each other.

Yet another object of the embodiments herein is to provide a self-adhesive tape for enabling a user to assemble and solder a plurality of LED strip tapes in a light box easily and conveniently.

Yet another object of the embodiments herein is to provide a self-adhesive tape capable of powering a plurality of LED strip tapes connected to the self-adhesive tape in a light box.

Yet another object of the embodiments herein is to provide a self-adhesive tape comprising large soldering pads, for ensuring a quality and reliable connection while soldering the LED strip tapes.

Yet another object of the embodiments herein is to provide a self-adhesive tape capable of lighting all types of LED strip tapes available in the market.

Yet another object of the embodiments herein is to provide a self-adhesive tape capable of lighting three color, four color and five color LED strip tapes of different widths available in market.

Yet another object of the embodiments herein is to provide a self-adhesive tape capable of connecting a plurality of LED strips at a desired spacing or interval between each LED strip tapes.

Yet another object of the embodiments herein is to provide a self-adhesive tape thereby eliminating a need for connecting the power wires to each LED strip tapes, thereby reducing a labor required in lighting the LED strip tapes.

Yet another object of the embodiments herein is to provide a self-adhesive speed tape assembly for LED strip tapes in a light box These and other objects and advantages of the embodiments herein will become readily apparent from the following detailed description taken in conjunction with the accompanying drawings.

SUMMARY

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

The various embodiments herein provide a self-adhesive tape assembly for providing electrical connections to a plurality of LED strip tapes. The self-adhesive tape is attached to one side of a light box to be illuminated using a plurality of LED strip tapes. Further, the plurality of LED strip tapes is assembled at a desired spacing/interval. The plurality of copper pads on each LED strip tapes are soldered to the plurality of copper pads on the self-adhesive tape for providing electrical connection for the plurality of LED strip tapes. Further, the power supply wires are connected to a set of the copper pads provided on the self-adhesive tape for providing an electric power to the plurality of the LED strip tapes.

According to an embodiment herein, a self-adhesive tape assembly for Light emitting diode (LED) strip tapes in a light box is provided. The self-adhesive tape assembly comprises a self-adhesive tape comprising a plurality of speed tapes, and wherein the plurality of speed tapes is configured to attach a plurality of LED strip tapes in the light box or to any other applications. An adhesive strip is configured for attaching the self-adhesive tape to one side of the light box. The adhesive strip is provided at a back side of the self-adhesive tape along a length direction. A plurality of first group of copper pads is provided in each of the plurality of speed tapes. The plurality of first group of copper pads is configured to establish electrical connection to the plurality of LED strip tapes. A plurality of second group of copper pads is provided in each of the plurality of speed tapes. The plurality of second group of copper pads is configured to supply electrical power for activating/illuminating the plurality of LED strip tapes. The plurality of second group of copper pads are soldered to a plurality of power supply wires connected to a Digital Multiplex (DMX) switch controller. A plurality of third group of copper pads provided in each LED strip tape. The plurality of third group of copper pads on each LED strip tape is soldered respectively to the plurality of first group of copper pads on one speed tape for establishing an electrical connection. An electrical power is supplied to a positive voltage copper pad in the plurality of first group of copper pads and in the plurality of second group of copper pads along the speed tape, and remaining copper pads in the plurality of first group of copper pads and in the plurality of second group of copper pads is connected to earth (ground) to complete an electrical circuit for activating/illuminating the plurality of LED strip tapes.

According to an embodiment herein, the plurality of speed tapes is selected from a group consisting of a single circuit speed tape, a three circuit speed tape, a four circuit speed tape and a five circuit speed tape.

According to an embodiment herein, the plurality of LED strip tapes is selected from group consisting of a single colour LED strip tape, a three colour LED strip tape, a four colour LED strip tape and a five colour LED strip tape.

According to an embodiment herein, the single circuit speed tape is designed to activate/illuminate the single colour LED strip tape.

According to an embodiment herein, the three circuit speed tape is designed to activate/illuminate the three colour LED strip tape.

According to an embodiment herein, the four circuit speed tape is designed to activate/illuminate the four colour LED strip tape.

According to an embodiment herein, the five circuit speed tape is designed to activate/illuminate the five colour LED strip tape.

According to an embodiment herein, a number of copper pads in the plurality of first group of copper pads, the plurality of second group of copper pads and in the plurality of third group of copper pads are mutually different.

According to an embodiment herein, the plurality of first group of copper pads comprises a plurality of copper pads spaced at a distance of one inch for installing the plurality of LED strip tapes at a desired spacing.

According to an embodiment herein, the plurality of third group of copper pads on each LED strip tape is assembled in line with the plurality of first group of copper pads on the speed tape for soldering.

According to an embodiment herein, each of the LED strip tape comprises a plurality of LED lights for illuminating the light box.

According to an embodiment herein, the plurality of first group of copper pads provided on alternate speed tapes on the plurality of speed tapes excepting the single circuit speed tape comprises pads with mutually different sizes.

According to an embodiment herein, a method is provided for installing a plurality of LED strip tapes using a self-adhesive tape assembly. The method comprises selecting a type of the plurality of LED strip tapes for illuminating a light box. The plurality of LED strip tapes is selected from a group consisting of a single colour LED strip tape, a three colour LED strip tape, a four colour LED strip tape and a five colour LED strip tape. A self-adhesive speed tape designed to activate/illuminate the selected type of the plurality of LED strip tapes identified. The self-adhesive speed tape is attached to one side of the light box. The self-adhesive speed tape is attached using an adhesive strip. The adhesive strip is provided at a back side of the self-adhesive tape along a length direction. Each LED strip tape is attached to the identified self-adhesive speed tape after selecting a desired spacing for installing the plurality of LED strip tapes. Each LED strip tape is attached using an adhesive strip provided at a back side of the LED strip tape.

A plurality of third group of copper pads soldered on each LED strip tape with a plurality of first group of copper pads provided on the self-adhesive speed tape. The plurality of third group of copper pads on each LED strip tape is placed in line with the plurality of first group of copper pads on the self-adhesive speed tape. A plurality of power supply wires is connected to a second group of copper pads provided on the self-adhesive speed tape. The electrical power is supplied to a positive voltage copper pad in the plurality of first group of copper pads and in the plurality of second group of copper pads along the speed tape and remaining copper pads in the plurality of first group of copper pads and in the plurality of second group of copper pads is connected to earth (ground) to complete an electrical circuit for activating/illuminating the plurality of LED strip tapes.

According to an embodiment herein, the self-adhesive speed tape is identified from a group consisting of a single circuit self-adhesive speed tape, a three circuit self-adhesive speed tape, a four circuit self-adhesive speed tape and a five circuit self-adhesive speed tape.

According to an embodiment herein, each copper pad in the plurality of first group of copper pads is arranged at a preset interval on the self-adhesive speed tape.

According to an embodiment herein, the plurality of the LED strip tapes are installed at a desired spacing using the self-adhesive speed tape.

According to an embodiment herein, the power supply wires connected to the plurality of second group of copper pads are connected to a Digital Multiplex (DMX) switch controller.

According to an embodiment herein, a self-adhesive tape for providing electrical connections to a plurality of Light emitting diode (LED) strip tapes arranged in light box is provided. The self-adhesive tape comprises an adhesive strip, a plurality of first set of copper pads, a plurality of second set of copper pads, and a circuit. The adhesive strip is configured for attaching the self-adhesive tape to one side of the box. The adhesive strip is provided at a back side along a length of the self-adhesive tape. The plurality of first set of copper pads is configured for providing electrical connection to the plurality of LED strip tapes. The electrical connections are provided by soldering a third set of copper pad on each LED strip tape with a first set of copper pad on the self-adhesive tape. The plurality of first set of copper pads is arranged at a preset interval and wherein the preset interval is configured by the user based on requirement. The plurality of second set of copper pads is configured for supplying power for the plurality of LED strip tapes. The plurality of second set of copper pads are soldered to the power supply wires connected to a Digital Multiplex (DMX) switch controller. The circuit is embedded on the self-adhesive tape configured for activating the plurality of LED strip tapes.

According to an embodiment herein, the self-adhesive tape is selected from a group consisting of a single circuit adhesive tape, a three circuit adhesive tape, a four circuit adhesive tape and a five circuit adhesive tape.

According to an embodiment herein, the plurality of LED strip tapes are selected from group consisting of a single color LED strip tape, a three color LED strip tape, a four color LED strip tape and a five color LED strip tape.

According to an embodiment herein, the single circuit adhesive tape is designed to activate/illuminate the single color LED strip tape.

According to an embodiment herein, the three circuit adhesive tape is designed to activate/illuminate the three color LED strip tape.

According to an embodiment herein, the four circuit adhesive tape is designed to activate/illuminate the four color LED strip tape.

According to an embodiment herein, the five circuit adhesive tape is designed to activate/illuminate the five color LED strip tape.

According to an embodiment herein, the plurality of first set of copper pads is spaced at a preset distance of one inch for installing the plurality of LED strip tapes at a desired interval.

According to an embodiment herein, the third set of copper pad on each LED strip tape is assembled in line with the first set of copper pad on the self-adhesive strip tape for soldering.

According to an embodiment herein, each LED strip tape comprises a plurality of LED lights for illuminating the light box.

According to an embodiment herein, the plurality of first set of copper pads on a three circuit adhesive tape comprises a plurality of second set of copper pads. The plurality of second set of copper different widths. Each alternate pad has a mutually different width.

According to an embodiment herein, a method of installing a plurality of LED strip tapes using a self-adhesive tape is provided. The method includes selecting one type of the plurality of LED strip tapes for a light box. The plurality of LED strip tapes is selected from a group consisting of a single color LED strip tape, a three color LED strip tape, a four color LED strip tape and a five color LED strip tape. A self-adhesive tape designed to activate/illuminate the selected type of the plurality of LED strip tapes is identified. Further, the self-adhesive tape is attached to one side of a box. The self-adhesive tape is attached using an adhesive strip at the back side along a length of the self-adhesive tape. Each LED strip tape is attached to self-adhesive tape which is provided at a preset interval for installing the plurality of LED strip tapes. Each LED strip tape is attached using an adhesive strip at the back side of the LED strip tape. A set of copper pads on each LED strip tape is soldered to a first set of copper pads on the self-adhesive tape. The set of copper pads on each LED strip tape is placed in line with the first set of copper pads on the self-adhesive tape. The power supply wires are connected to a second set of copper pads on the self-adhesive tape. The power supply wire is configured to provide electrical power for activating/illuminating the plurality of LED strip tapes.

According to an embodiment herein, the self-adhesive tape is identified from a group consisting of a single circuit adhesive tape, a three circuit adhesive tape, a four circuit adhesive tape and a five circuit adhesive tape.

According to an embodiment herein, each first set of copper pads is arranged at a preset interval of one inch on the self-adhesive tape.

According to an embodiment herein, the plurality of the LED strip tapes are installed at the preset interval using the self-adhesive tape.

According to an embodiment herein, the power supply wires connected to the second set of copper pads are connected to a Digital Multiplex (DMX) switch controller.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

BRIEF DESCRIPTION OF THE DRAWINGS

The other objects, features and advantages will occur to those skilled in the art from the following description of the preferred embodiment and the accompanying drawings in which.

Figure 1:
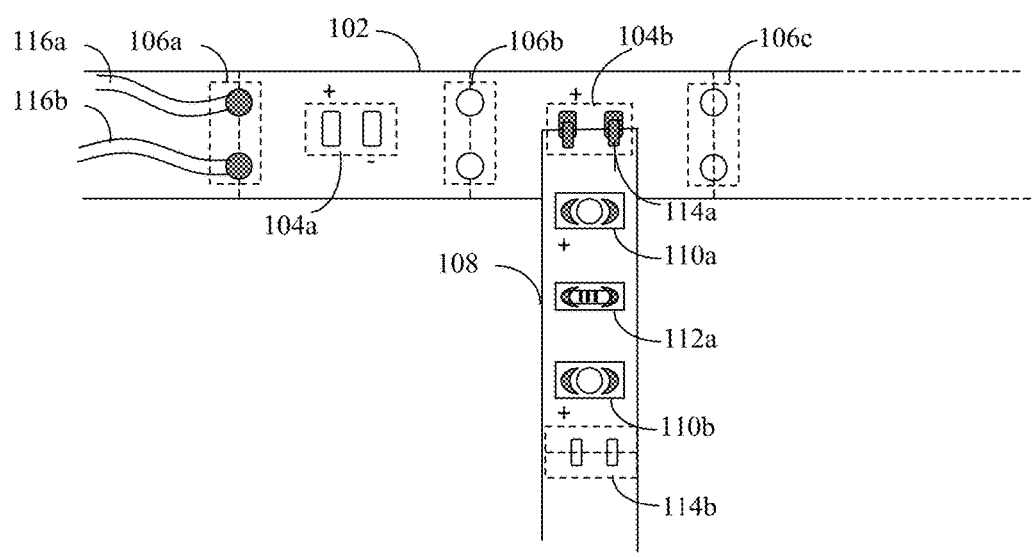
FIG. 1 illustrates a schematic representation of a self-adhesive tape for providing electrical connection to a plurality of single color LED strip tape, according to one embodiment herein.

Although the specific features of the embodiments herein are shown in some drawings and not in others. This is done for convenience only as each feature may be combined with any or all of the other features in accordance with the embodiments herein.

DETAILED DESCRIPTION OF THE EMBODIMENTS

In the following detailed description, a reference is made to the accompanying drawings that form a part hereof, and in which the specific embodiments that may be practiced is shown by way of illustration. These embodiments are described in sufficient detail to enable those skilled in the art to practice the embodiments and it is to be understood that the logical, mechanical and other changes may be made without departing from the scope of the embodiments. The following detailed description is therefore not to be taken in a limiting sense.

The various embodiments herein provide a self-adhesive tape assembly for providing electrical connections to a plurality of LED strip tapes. The self-adhesive tape is attached to one side of a light box to be illuminated using a plurality of LED strip tapes. Further, the plurality of LED strip tapes is assembled at a desired spacing/interval. The plurality of copper pads on each LED strip tapes are soldered to the plurality of copper pads on the self-adhesive tape for providing electrical connection for the plurality of LED strip tapes. Further, the power supply wires are connected to a set of the copper pads provided on the self-adhesive tape for providing an electric power to the plurality of the LED strip tapes.

According to an embodiment herein, a self-adhesive tape assembly for Light Emitting Diode (LED) strip tapes in a light box is provided. The self-adhesive tape assembly comprises a self-adhesive tape comprising a plurality of speed tapes, and wherein the plurality of speed tapes is configured to attach a plurality of LED strip tapes in the light box. An adhesive strip is configured for attaching the self-adhesive tape to one side of the light box. The adhesive strip is provided at a back side of the self-adhesive tape along a length direction. A plurality of first group of copper pads is provided in each of the plurality of speed tapes. The plurality of first group of copper pads is configured to establish electrical connection to the plurality of LED strip tapes. A plurality of second group of copper pads is provided in each of the plurality of speed tapes. The plurality of second group of copper pads is configured to supply electrical power for activating/illuminating the plurality of LED strip tapes. The plurality of second group of copper pads are soldered to a plurality of power supply wires connected to a Digital Multiplex (DMX) switch controller. A plurality of third group of copper pads provided in each LED strip tape. The plurality of third group of copper pads on each LED strip tape is soldered respectively to the plurality of first group of copper pads on one speed tape for establishing an electrical connection. An electrical power is supplied to a positive voltage copper pad in the plurality of first group of copper pads and in the plurality of second group of copper pads along the speed tape, and remaining copper pads in the plurality of first group of copper pads and in the plurality of second group of copper pads is connected to earth (ground) to complete an electrical circuit for activating/illuminating the plurality of LED strip tapes.

According to an embodiment herein, the plurality of speed tapes is selected from a group consisting of a single circuit speed tape, a three circuit speed tape, a four circuit speed tape and a five circuit speed tape.

According to an embodiment herein, the plurality of LED strip tapes is selected from group consisting of a single colour LED strip tape, a three colour LED strip tape, a four colour LED strip tape and a five colour LED strip tape.

According to an embodiment herein, the single circuit speed tape is designed to activate/illuminate the single colour LED strip tape.

According to an embodiment herein, the three circuit speed tape is designed to activate/illuminate the three colour LED strip tape.

According to an embodiment herein, the four circuit speed tape is designed to activate/illuminate the four colour LED strip tape.

According to an embodiment herein, the five circuit speed tape is designed to activate/illuminate the five colour LED strip tape.

According to an embodiment herein, a number of copper pads in the plurality of first group of copper pads, the plurality of second group of copper pads and in the plurality of third group of copper pads are mutually different.

According to an embodiment herein, the plurality of first group of copper pads comprises a plurality of copper pads spaced at a preset distance for installing the plurality of LED strip tapes at a desired spacing.

According to an embodiment herein, the plurality of third group of copper pads on each LED strip tape is assembled in line with the plurality of first group of copper pads on the speed tape for soldering.

According to an embodiment herein, each of the LED strip tape comprises a plurality of LED lights for illuminating the light box.

According to an embodiment herein, the plurality of first group of copper pads provided on alternate speed tapes on the plurality of speed tapes excepting the single circuit speed tape comprises pads with mutually different sizes.

According to an embodiment herein, a method is provided for installing a plurality of LED strip tapes using a self-adhesive tape assembly. The method comprises selecting a type of the plurality of LED strip tapes for illuminating a light box. The plurality of LED strip tapes is selected from a group consisting of a single colour LED strip tape, a three colour LED strip tape, a four colour LED strip tape and a five colour LED strip tape. A self-adhesive speed tape designed to activate/illuminate the selected type of the plurality of LED strip tapes identified. The self-adhesive speed tape is attached to one side of the light box. The self-adhesive speed tape is attached using an adhesive strip. The adhesive strip is provided at a back side of the self-adhesive tape along a length direction. Each LED strip tape is attached to the identified self-adhesive speed tape after selecting a desired spacing for installing the plurality of LED strip tapes. Each LED strip tape is attached using an adhesive strip provided at a back side of the LED strip tape.

A plurality of third group of copper pads soldered on each LED strip tape with a plurality of first group of copper pads provided on the self-adhesive speed tape. The plurality of third group of copper pads on each LED strip tape is placed in line with the plurality of first group of copper pads on the self-adhesive speed tape. A plurality of power supply wires is connected to a second group of copper pads provided on the self-adhesive speed tape. The electrical power is supplied to a positive voltage copper pad in the plurality of first group of copper pads and in the plurality of second group of copper pads along the speed tape and remaining copper pads in the plurality of first group of copper pads and in the plurality of second group of copper pads is connected to a negative voltage terminal to complete an electrical circuit for activating/illuminating the plurality of LED strip tapes.

According to an embodiment herein, the self-adhesive speed tape is identified from a group consisting of a single circuit self-adhesive speed tape, a three circuit self-adhesive speed tape, a four circuit self-adhesive speed tape and a five circuit self-adhesive speed tape.

According to an embodiment herein, each copper pad in the plurality of first group of copper pads is arranged at a preset interval on the self-adhesive speed tape.

According to an embodiment herein, the plurality of the LED strip tapes are installed at a desired spacing using the self-adhesive speed tape.

According to an embodiment herein, the power supply wires connected to the plurality of second group of copper pads are connected to a Digital Multiplex (DMX) switch controller.

According to an embodiment herein, a self-adhesive tape for providing electrical connections to a plurality of Light Emitting Diode (LED) strip tapes arranged in light box is provided. The self-adhesive tape comprises an adhesive strip, a plurality of first set of copper pads, a plurality of second set of copper pads, and a circuit. The adhesive strip is configured for attaching the self-adhesive tape to one side of the box. The adhesive strip is provided at a back side along a length of the self-adhesive tape. The plurality of first set of copper pads is configured for providing electrical connection to the plurality of LED strip tapes. The electrical connections are provided by soldering a third set of copper pad on each LED strip tape with a first set of copper pad on the self-adhesive tape. The plurality of first set of copper pads is arranged at a preset interval and wherein the preset interval customized by the user based on a requirement. The plurality of second set of copper pads is configured for supplying power for the plurality of LED strip tapes. The plurality of second set of copper pads are soldered to the power supply wires connected to a Digital Multiplex (DMX) switch controller. The circuit is embedded on the self-adhesive tape configured for activating the plurality of LED strip tapes.

According to an embodiment herein, the self-adhesive tape is selected from a group consisting of a single circuit adhesive tape, a three circuit adhesive tape, a four circuit adhesive tape and a five circuit adhesive tape.

According to an embodiment herein, the plurality of LED strip tapes are selected from group consisting of a single color LED strip tape, a three color LED strip tape, a four color LED strip tape and a five color LED strip tape.

According to an embodiment herein, the single circuit adhesive tape is designed to activate/illuminate the single color LED strip tape.

According to an embodiment herein, the three circuit adhesive tape is designed to activate/illuminate the three color LED strip tape.

According to an embodiment herein, the four circuit adhesive tape is designed to activate/illuminate the four color LED strip tape.

According to an embodiment herein, the five circuit adhesive tape is designed to activate/illuminate the five color LED strip tape.

According to an embodiment herein, the plurality of first set of copper pads is spaced at a preset distance of one inch for installing the plurality of LED strip tapes at a desired interval.

According to an embodiment herein, the third set of copper pad on each LED strip tape is assembled in line with the first set of copper pad on the self-adhesive strip tape for soldering.

According to an embodiment herein, each LED strip tape comprises a plurality of LED lights for illuminating the box.

According to an embodiment herein, the plurality of first set of copper pads on a three circuit adhesive tape comprises a plurality of second set of copper pads. The plurality of second set of copper different widths. Each alternate pad has a mutually different width.

According to an embodiment herein, a method of installing a plurality of LED strip tapes using a self-adhesive tape is provided. The method includes selecting one type of the plurality of LED strip tapes for a light box. The plurality of LED strip tapes is selected from a group consisting of a single color LED strip tape, a three color LED strip tape, a four color LED strip tape and a five color LED strip tape. A self-adhesive tape designed to activate/illuminate the selected type of the plurality of LED strip tapes is identified. Further, the self-adhesive tape is attached to one side of a box. The self-adhesive tape is attached through an adhesive strip provided at the back side along a length of the self-adhesive tape. Each LED strip tape is attached to self-adhesive tape which is provided at a preset interval for installing the plurality of LED strip tapes. Each LED strip tape is attached using an adhesive strip at the back side of the LED strip tape. A set of copper pads on each LED strip tape is soldered to a first set of copper pads on the self-adhesive tape. The set of copper pads on each LED strip tape is placed in line with the first set of copper pads on the self-adhesive tape. The power supply wires are connected to a second set of copper pads on the self-adhesive tape. The power supply wire is configured to provide electrical power for activating/illuminating the plurality of LED strip tapes.

According to an embodiment herein, the self-adhesive tape is identified from a group consisting of a single circuit adhesive tape, a three circuit adhesive tape, a four circuit adhesive tape and a five circuit adhesive tape.

According to an embodiment herein, each first set of copper pads is arranged at a preset interval on the self-adhesive tape.

According to an embodiment herein, the plurality of the LED strip tapes are installed at the preset interval using the self-adhesive tape.

According to an embodiment herein, the power supply wires connected to the second set of copper pads are connected to a Digital Multiplex (DMX) switch controller.

FIG. 1 illustrates a schematic diagram of a self-adhesive tape for providing electrical connection to a plurality of single color LED strip tape, according to one embodiment herein. The self-adhesive tape 102 is a single circuit adhesive tape designed for providing electrical connection and powering a plurality of single color LED strip tapes. The single color LED strip tape typically comprises white color LED lights. The self-adhesive tape 102 comprises a plurality of first set of copper pads 104a, 104b . . . 104n, and a plurality of second set of copper pads 106a, 106b . . . 106n. The self-adhesive tape 102 is capable of providing electrical connection for a plurality of single color LED strip tapes.

A single color LED strip tape 108 among the plurality of single color LED strip tape comprises a plurality of LED lights 110a, 110b . . . 110n and a plurality of resistance 112a . . . 112n and a plurality of third set of copper pads 114a, 114b . . . 114n. Each of the plurality of first set of copper pads 104a, 104b . . . 104n, the plurality of second set of copper pads 106a, 106b . . . 106n and the plurality of third set of copper pads 114a, 114b . . . 114n comprises two copper pads.

The self-adhesive tape 102 comprises an adhesive strip provided at the back side along the length of the self-adhesive tape 102. The self-adhesive tape 102 is attached to one side of the area to be lighted by the plurality of LED strip tapes. The self-adhesive tape 102 enables a user to install the plurality of single color LED strip tapes as close to each other. The user is allowed to place the plurality of single color LED strip tapes at a desired spacing.

Once the desired spacing is selected, a third set of copper pad 114a along the single color LED strip tape 108 is cut along a line at the center. The third set of copper pad 114a is placed in line with a first set of copper pad 104b as shown in FIG. 1. The third set of copper pad 114a is soldered with the first set of copper pad 104b to provide electrical connection. As the self-adhesive tape is attached to the surface using the adhesive strip at the back side, the user is enabled solder the third set of copper pads 114a to the first set of copper pad 104b. The single color LED strip tape 108 is also attached to the surface by using an adhesive strip at the back of the LED strip tape. Similarly all the LED strip tapes among the plurality of single color LED strip tapes are soldered to one among the plurality of the first set of copper pads 104a, 104b . . . 104n on the self-adhesive tape 102.

Further, the power supply wires 116a and 116b connected to a Digital Multiplex (DMX) switch controller are soldered to a second set of copper pad 106a among the plurality of second set of solder pads 106a, 106b . . . 106n along the self-adhesive tape 102. The power supply wire 116a is connected to a first copper pad in the second set of copper pad 106a to provide a positive connection. Further, the power supply wire 116b is connected to second copper pad in the second set of copper pad 106a to provide a negative connection. The power supply wires 116a and 116b connected to the self-adhesive tape provides power required for activating/illuminating the plurality of single color LED strip tapes. The power received by the single color LED strip tape 108 activates the plurality of LED lights 110a, 110b, . . . 110n. Thus, the user is not required to solder power supply wires 116a and 116b to each single color LED strip tape. Therefore, the effort, time and cost of installing the single color LED strip tapes are greatly reduced by using the self-adhesive tape 102.

Figure 2:
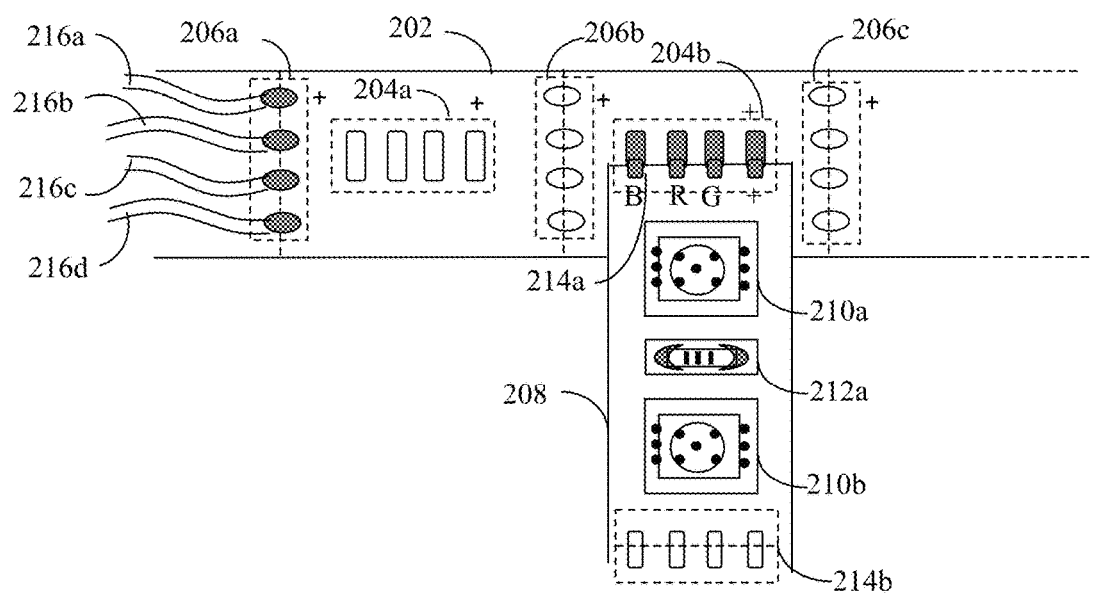
FIG. 2 illustrates a schematic representation of a self-adhesive tape for providing electrical connection to a plurality of three color LED strip tape, according to one embodiment herein.

FIG. 2 illustrates a schematic diagram of a self-adhesive tape for providing electrical connection to a plurality of three color LED strip tape, according to one embodiment herein. The self-adhesive tape 202 is capable of providing electrical connection for a plurality of three color LED strip tapes. The three color LED strip tapes are RGB strip tapes for providing Red, Green and Blue lights. The self-adhesive tape 202 is a three circuit adhesive tape designed to provide electrical connection to three different colored LED lights in a three color LED strip tape. The self-adhesive tape 202 comprises a plurality of first set of copper pads 204a, 204b . . . 204n, and a plurality of second set of copper pads 206a, 206b . . . 206n.

A three color LED strip tape 208 among the plurality of three color LED strip tape comprises a plurality of LED lights 210a, 210b . . . 210n and a plurality of resistance 212a . . . 212n and a plurality of third set of copper pads 214a, 214b . . . 214n. Each of the plurality of first set of copper pads 204a, 204b . . . 204n, the plurality of second set of copper pads 206a, 206b . . . 206n and the plurality of third set of copper pads 214a, 214b . . . 114n comprises four copper pads.

The self-adhesive tape 202 comprises an adhesive strip provided at the back side along the length of the self-adhesive tape 202. The self-adhesive tape 202 is attached to one side of the area to be lighted by the plurality of three color LED strip tapes. The self-adhesive tape 202 enables a user to install the plurality of three color LED strip tapes as close to each other. The user is allowed to place the plurality of three color LED strip tapes at a desired spacing. The plurality of first set of copper pads 204a, 204b . . . 204n is designed with alternate first set of copper pads with a mutually different widths of 10 mm and 12 mm. The design allows the user to use any RGB tape available in the market. Therefore, the self-adhesive tape 302 enables the arrangement of the RGB tape with a width of 10 mm at a desired spacing. Similarly, the RGB tape with a width of 12 mm is arranged at a desired spacing.

Once the desired spacing is selected, a third set of copper pad 214a along the three color LED strip tape 208 is cut along the center. The third set of copper pad 214a is placed in line with a first set of copper pad 204b as shown in FIG. 2. The third set of copper pad 214a is soldered with the first set of copper pad 204b to provide electrical connection. The positive terminal on the third set of copper pad 214a is connected to the positive terminal on the first set of copper pad 204b. Further, the G, R and B terminal on the third set of copper pad 214a is placed in line with the second, third and fourth copper pad on the first set of copper pad 204b.

The self-adhesive tape 202 attached to the surface enables the user to solder the third set of copper pads 214a to the first set of copper pad 204b. The three color LED strip tape 208 is also attached perpendicularly to the self-adhesive tape using an adhesive strip at the back of the three color LED strip tape 208. Further, the three color LED strip tape 208 is soldered to the first set of copper pad 204b. Similarly all the three color LED strip tapes among the plurality of three color LED strip tapes are soldered to a first set of copper pad among the plurality of the first set of copper pads 204a, 204b . . . 204n on the self-adhesive tape 202.

Further, the power supply wires 216a, 216b, 216c and 216b connected to a DMX switch controller is soldered to a second set of copper pad 206a among the plurality of second set of solder pads 206a, 206b . . . 206n along the self-adhesive tape 208. The power supply wire 216a is connected to a first copper pad in the second set of copper pad 206a to provide a positive connection. Further, the power supply wires 216b, 216c and 216d are connected to second copper pad, third copper pad and fourth copper pad in the second set of copper pad 206a to provide a negative connection for Red, Green and Blue LED lights. The power supply wires 216a, 216b, 216c and 216b are connected to the self-adhesive tape to provide power required for activating/illuminating the plurality of three color LED strip tapes. Thus, the user is not required to solder power supply wires 216a, 216b, 216c and 216b to each three color LED strip tape. Therefore, the effort, time and cost of installing the RGB LED strip tapes are greatly reduced by using self-adhesive tape 202. Thus the power is utilized to activate the plurality of LED lights 210a, 210b, . . . 210n. Similarly the plurality of LED strip tapes are power using the power supplied to the self-adhesive tape 202.

Figure 3:
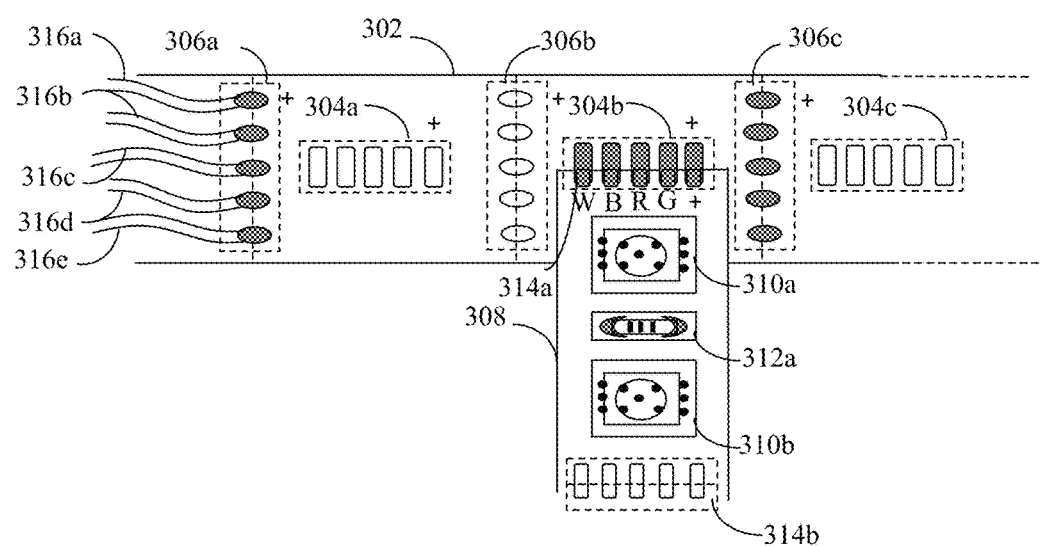
FIG. 3 illustrates a schematic representation of a self-adhesive tape for providing electrical connection to a plurality of four color LED strip tape, according to one embodiment herein.

FIG. 3 illustrates a schematic diagram of a self-adhesive tape for providing an electrical connection to a plurality of four color LED strip tape, according to one embodiment herein. The self-adhesive tape 302 is capable of providing electrical connection for a plurality of four color LED strip tapes. The four color LED strip tapes are RGBW strip tapes providing Red, Green, Blue and White cool or warm lights. The self-adhesive tape 302 is a four circuit adhesive tape designed to provide electrical connection to four different colored LED lights in a four color LED strip tape. The self-adhesive tape 302 comprises a plurality of first set of copper pads 304a, 304b . . . 304n, and a plurality of second set of copper pads 306a, 306b . . . 306n.

A four color LED strip tape 308 among the plurality of four color LED strip tape comprises a plurality of LED lights 310a, 310b . . . 310n and a plurality of resistance 312a . . . 312n and a plurality of third set of copper pads 314a, 314b . . . 314n. Each of the plurality of first set of copper pads 304a, 304b . . . 304n, the plurality of second set of copper pads 306a, 306b . . . 306n and the plurality of third set of copper pads 314a, 314b . . . 314n comprises five copper pads.

The self-adhesive tape 302 enables a user to install the plurality of four color LED strip tapes as close to each other. The user is allowed to place the plurality of four color LED strip tapes at a desired spacing with each other. Once the desired spacing is selected, a third set of copper pad 314a along the four color LED strip tape 308 is cut along the center. The third set of copper pad 314a is placed in line with a first set of copper pad 304b as shown in FIG. 3. The third set of copper pad 314a is soldered with the first set of copper pad 304b to provide electrical connection. The positive terminal on the third set of copper pad 314a is connected to the positive terminal on the first set of copper pad 304b. Further, the R, G, B and W terminal on the third set of copper pad 314a is placed in line with the second, third, fourth and fifth copper pad among the first set of copper pad 304b.

The self-adhesive tape 302 attached to the surface enables the user to solder the self-adhesive tape 302 with the plurality of LED strip tapes. The four color LED strip tape 308 is also attached to the surface by using an adhesive strip at the back of the four color LED strip tape 308. The four color LED strip tape 308 is installed by soldering the third set of copper pads 314a to the first set of copper pad 304b. Similarly, each four color LED strip tape among the plurality of four color LED strip tapes are soldered to a first set of copper pad among the plurality of the first set of copper pads 304a, 304b . . . 304n on the self-adhesive tape 302.

Further, the power supply wires 316a, 316b, 316c, 316b and 316e connected to a DMX switch controller soldered to a second set of copper pad 306a among the plurality of second set of solder pads 306a, 306b . . . 306n along the self-adhesive tape 308. The power supply wire 316a is connected to a first copper pad in the second set of copper pad 306a to provide a positive connection. Further, the power supply wires 316b, 316c, 316d and 316e are connected to second copper pad, third copper pad fourth copper pad and fifth copper pad in the second set of copper pad 306a to provide a negative connection for Red, Green, Blue and White LED lights. The power supply wires 316a, 316b, 316c, 316d and 316e are connected to the self-adhesive tape to provide power required for activating the plurality of four color LED strip tapes. Thus, the user is not required to solder power supply wires 316a, 316b, 316c, 316d and 316e to each four color LED strip tape. Therefore, the effort, time and cost of installing the RGBW LED strip tapes are greatly reduced by using self-adhesive tape 302.

Figure 4:
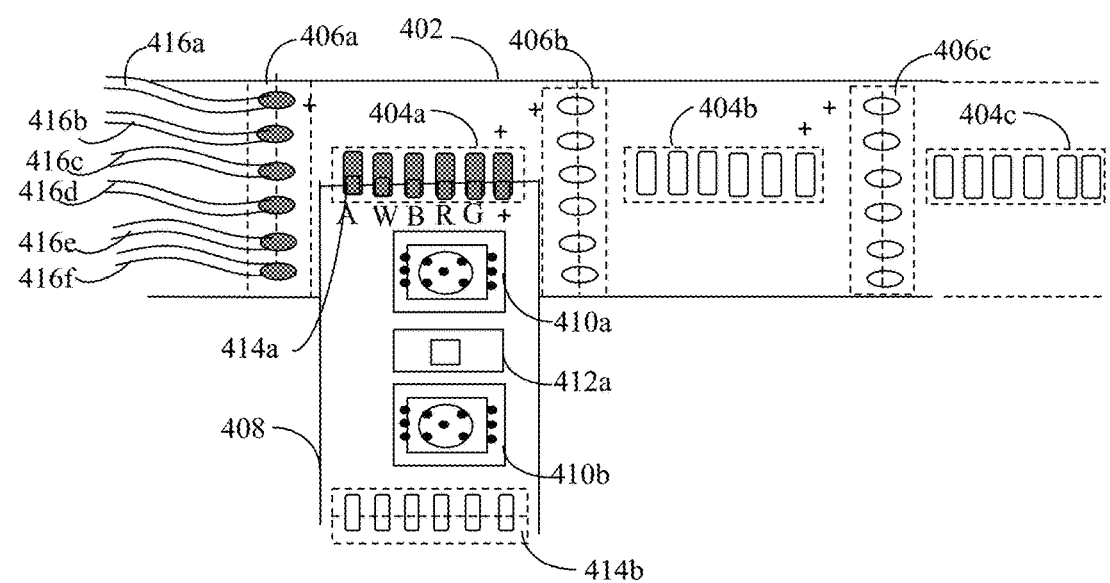
FIG. 4 illustrates a schematic representation of a self-adhesive tape for providing electrical connection to a plurality of five color LED strip tape, according to one embodiment herein.

FIG. 4 illustrates a schematic diagram of a self-adhesive tape for providing an electrical connection to a plurality of five color LED strip tape, according to one embodiment herein. The self-adhesive tape 402 is capable of providing electrical connection for a plurality of five color LED strip tapes. The five color LED strip tapes are RGBACW strip tapes providing Red, Green, Blue, Amber and Cool White lights. The self-adhesive tape 402 is a five circuit adhesive tape designed to provide electrical connection to five different colored LED lights in a five color LED strip tape. The self-adhesive tape 402 comprises a plurality of first set of copper pads 404a, 404b . . . 404n, and a plurality of second set of copper pads 406a, 406b . . . 406n.

A five color LED strip tape 408 among the plurality of five color LED strip tape comprises a plurality of LED lights 410a, 410b . . . 410n and a plurality of resistance 412a . . . 412n and a plurality of third set of copper pads 414a, 414b . . . 414n. Each of the plurality of first set of copper pads 404a, 404b . . . 404n, the plurality of second set of copper pads 406a, 406b . . . 406n and the plurality of third set of copper pads 414a, 414b . . . 414n comprises six copper pads.

The self-adhesive tape 402 enables a user to install the plurality of five color LED strip tapes as close to each other. The user is allowed to place the plurality of five color LED strip tapes at a desired spacing with each other. Once the desired spacing is selected, a third set of copper pad 414a along the fiver color LED strip tape 408 is cut along the center. The third set of copper pad 414a is placed in line with a first set of copper pad 404b as shown in FIG. 4. The third set of copper pad 414a is soldered with the first set of copper pad 404b to provide electrical connection. The positive terminal on the third set of copper pad 414a is connected to the positive terminal on the first set of copper pad 404b. Further, the A, R, G, B and W terminal on the third set of copper pad 414a is placed in line with the second, third, fourth and fifth copper pad among the first set of copper pad 404b.

The self-adhesive tape 402 attached to the surface enables the user to solder the self-adhesive tape 402 with the plurality of LED strip tapes. The five color LED strip tape 408 is also attached to the surface by using an adhesive strip at the back of the five color LED strip tape 408. The five color LED strip tape 408 is installed by soldering the third set of copper pads 414a to the first set of copper pad 404b. Similarly, each five color LED strip tape among the plurality of five color LED strip tapes are soldered to a first set of copper pad among the plurality of the first set of copper pads 404a, 404b . . . 404n on the self-adhesive tape 402.

Further, the power supply wires 416a, 416b, 416c, 416d, 416e and 416f connected to a DMX switching controller are soldered to a second set of copper pad 406a among the plurality of second set of solder pads 406a, 406b . . . 406n along the self-adhesive tape 408. The power supply wire 416a is connected to a first copper pad in the second set of copper pad 406a to provide a positive connection. Further, the power supply wires 416b, 416c, 416d, 416e and 416f are connected to second copper pad, third copper pad fourth copper pad and fifth copper pad in the second set of copper pad 306a to provide a negative connection for Amber, Red, Green, Blue and White LED lights. The power supply wires 416a, 416b, 416c, 416d, 416e and 416f are connected to the self-adhesive tape to provide power required for activating the plurality of five color LED strip tapes. Thus, the user is not required to solder power supply wires 416a, 416b, 416c, 416d, 416e and 416f to each five color LED strip tape. Therefore, the effort, time and cost of installing the ARGBW LED strip tapes are greatly reduced by using self-adhesive tape 402.

Figure 5:
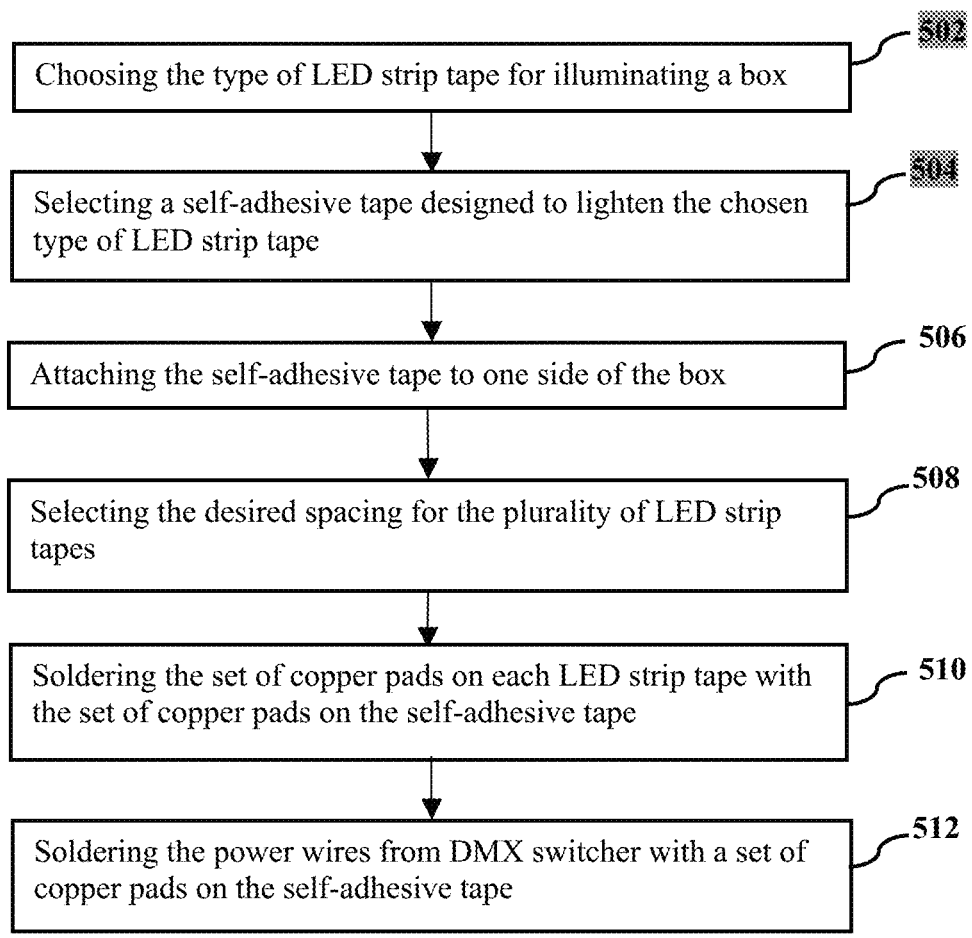
FIG. 5 illustrates a flow chart explaining a method of installing a plurality of LED strip tape using a self-adhesive tape, according to one embodiment herein.

FIG. 5 illustrates a flow chart explaining a method of installing a plurality of LED strip tape using a self-adhesive tape, according to one embodiment herein. Initially the type of LED strip tape is selected for illuminating (502). The user is enabled to select an LED strip tape from a group consisting of single circuit LED strip tape, a three circuit LED strip tape, a four circuit LED strip tape and a five circuit LED strip tape. Further, the user selects a self-adhesive tape designed to activate the chosen type of LED strip tape (504).

The self-adhesive tape is initially attached using an adhesive strip provided at the back of the self-adhesive tape (506).

Further, the desired spacing for the plurality of LED strip tapes is selected (508). The desired spacing between the LED strip tapes is selected. Further, a set of copper pads on each LED strip tapes are cut along a line through the center of the set of copper pads. The set of copper pads on each LED strip tape is arranged in line with a set of copper pads on the self-adhesive tape. The set of copper pads on each LED strip tape is soldered to the set of copper pads on the self-adhesive tape (510).

Further, power supply wires from DMX switching controller are soldered to a set of copper pads on the self-adhesive tape (512). The power supply wire connected to the positive terminal of the DMX switching controller is connected to a first pad and the power supply wire connected to the negative terminal is connected to a second pad. Therefore, the power supplied to the self-adhesive tape provides electrical power to the plurality of LED strip tape connected to the self-adhesive tape.

Therefore, the self-adhesive tape enables a user to install a plurality of LED strip tapes for illuminating. Since the self-adhesive tape is attached to one side of the box, the self-adhesive does not move while soldering. Further, the plurality of LED strip tapes is also attached to the surface of the box before soldering. Therefore, the user is enabled to solder the plurality of LED strip tapes with the self-adhesive tape effectively.

Further, there is no need for connecting power supply wires to each LED strip tapes among the plurality of LED strip tapes. The power supply wires connected any one set of pads on the self-adhesive tape is capable of supplying electrical power to the plurality of LED strip tapes installed using the self-adhesive tape. Therefore, the cost and effort of installing the plurality of LED is greatly reduced.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

Although the embodiments herein are described with various specific embodiments, it will be obvious for a person skilled in the art to practice the invention with modifications. However, all such modifications are deemed to be within the scope of the claims.

It is also to be understood that the following claims are intended to cover all of the generic and specific features of the embodiments described herein and all the statements of the scope of the embodiments which as a matter of language might be said to fall there between.

What is claimed is:

1. A self-adhesive tape assembly for Light Emitting Diode (LED) strip tapes, the self-adhesive tape assembly comprising:

a self-adhesive tape comprising a plurality of speed tapes, and wherein the plurality of speed tapes is configured to attach a plurality of LED strip tapes;

an adhesive strip configured for attaching the self-adhesive tape, wherein the adhesive strip is provided at a back side of the self-adhesive tape along a length direction;

a plurality of first group of copper pads provided in each of the plurality of speed tapes, and wherein the plurality of first group of copper pads is configured to establish electrical connection to the plurality of LED strip tapes;

a plurality of second group of copper pads provided in each of the plurality of speed tapes, and wherein the plurality of second group of copper pads is configured to supply electrical power for activating/illuminating the plurality of LED strip tapes, wherein the plurality of second group of copper pads are soldered to a plurality of power supply wires connected to a Digital Multiplex (DMX) switch controller; and a plurality of third group of copper pads provided in each LED strip tape, and wherein the plurality of third group of copper pads on each LED strip tape is soldered respectively to the plurality of first group of copper pads on one speed tape for establishing an electrical connection;

wherein electrical power is supplied to a positive voltage copper pad in the plurality of first group of copper pads and in the plurality of second group of copper pads along the speed Tape and remaining copper pads in the plurality of first group of copper pads and in the plurality of second group of copper pads is connected to a negative terminal or voltage to complete an electrical circuit for activating/illuminating the plurality of LED strip tapes.

2. The self-adhesive tape assembly according to claim 1, the plurality of speed tapes is selected from a group consisting of a single circuit speed tape, a three circuit speed tape, a four circuit speed tape and a five circuit speed tape.

3. The self-adhesive tape assembly according to claim 1, wherein the plurality of LED strip tapes is selected from group consisting of a single colour LED strip tape, a three colour LED strip tape, a four colour LED strip tape and a five colour LED strip tape.

4. The self-adhesive tape assembly according to claim 1, wherein the single circuit speed tape is designed to activate/illuminate the single colour LED strip tape.

5. The self-adhesive tape assembly according to claim 1, wherein the three circuit speed tape is designed to activate/illuminate the three colour LED strip tape.

6. The self-adhesive tape assembly according to claim 1, wherein the four circuit speed tape is designed to activate/illuminate the four colour LED strip tape.

7. The self-adhesive tape assembly according to claim 1, wherein the five circuit speed tape is designed to activate/illuminate the five colour LED strip tape.

8. The self-adhesive tape assembly according to claim 1, wherein a number of copper pads in the plurality of first group of copper pads, the plurality of second group of copper pads and in the plurality of third group of copper pads are mutually different.

9. The self-adhesive tape assembly according to claim 1, wherein the plurality of first group of copper pads comprises a plurality of copper pads spaced at a present distance for installing the plurality of LED strip tapes at a desired spacing.

10. The self-adhesive tape assembly according to claim 1, wherein the plurality of third group of copper pads on each LED strip tape is assembled in line with the plurality of first group of copper pads on the speed tape for soldering.

11. The self-adhesive tape assembly according to claim 1, each of the LED strip tape comprises a plurality of LED lights for illuminating.

12. The self-adhesive tape assembly according to claim 1, wherein the plurality of first group of copper pads provided on alternate speed tapes on the plurality of speed tapes excepting the single circuit speed tape comprises pads with mutually different sizes.

13. A method of installing a plurality of LED strip tapes using a self-adhesive tape assembly, the method comprises:

selecting type of the plurality of LED strip tapes for illuminating, wherein the plurality of LED strip tapes is selected from a group consisting of a single colour LED strip tape, a three colour LED strip tape, a four colour LED strip tape and a five colour LED strip tape;

identifying a self-adhesive speed tape designed to activate/illuminate the selected type of the plurality of LED strip tapes;

attaching the self-adhesive speed tape to one side, wherein the self-adhesive speed tape is attached using an adhesive strip, and wherein the adhesive strip is provided at a back side of the self-adhesive tape along a length direction;

attaching each LED strip tape to the identified self-adhesive speed tape after selecting a desired spacing for installing the plurality of LED strip tapes, wherein each LED strip tape is attached using an adhesive strip provided at a back side of the LED strip tape;

soldering a plurality of third group of copper pads on each LED strip tape with a plurality of first group of copper pads provided on the self-adhesive speed tape, wherein the plurality of third group of copper pads on each LED strip tape is placed in line with the plurality of first group of copper pads on the self-adhesive speed tape; and connecting a plurality of power supply wires to a second group of copper pads provided on the self-adhesive speed tape, wherein electrical power is supplied to a positive voltage copper pad in the plurality of first group of copper pads and in the plurality of second group of copper pads along the speed Tape and remaining copper pads in the plurality of first group of copper pads and in the plurality of second group of copper pads is connected to negative terminal to complete an electrical circuit for activating/illuminating the plurality of LED strip tapes.

14. The method according to claim 13, wherein the self-adhesive speed tape is identified from a group consisting of a single circuit self-adhesive speed tape, a three circuit self-adhesive speed tape, a four circuit self-adhesive speed tape and a five circuit self-adhesive speed tape.

15. The method according to claim 13, wherein each copper pad in the plurality of first group of copper pads is arranged at a preset interval on the self-adhesive speed tape.

16. The method according to claim 13, wherein the plurality of the LED strip tapes are installed at a desired spacing using the self-adhesive speed tape.

17. The method according to claim 13, wherein the power supply wires connected to the plurality of second group of copper pads are connected to a Digital Multiplex (DMX) switch controller.

* * * * *